(12) United States Patent
Chien

(10) Patent No.: US 6,388,501 B2
(45) Date of Patent: May 14, 2002

(54) MOSFET MIXER FOR LOW SUPPLY VOLTAGE

(75) Inventor: Hwey-Ching Chien, San Diego, CA (US)

(73) Assignee: Prominenet Communications Inc., San Diego, CA (US)

(*) Notice: Subject to any disclaimer, the term of this patent is extended or adjusted under 35 U.S.C. 154(b) by 0 days.

(21) Appl. No.: 09/886,233

(22) Filed: Jun. 22, 2001

Related U.S. Application Data

(63) Continuation-in-part of application No. 09/550,638, filed on Apr. 17, 2000, now abandoned.

(51) Int. Cl.⁷ .................................................. G06G 7/12
(52) U.S. Cl. ........................ 327/355; 327/356; 327/408
(58) Field of Search ................................. 327/355, 356, 327/408, 113, 114, 115, 116, 117, 118; 455/333; 329/358, 362

(56) References Cited

U.S. PATENT DOCUMENTS

| | | | | |
|---|---|---|---|---|
| 4,845,389 A | * | 7/1989 | Pyndiah et al. ............. | 327/113 |
| 5,083,050 A | * | 1/1992 | Vasile ......................... | 327/113 |
| 5,379,457 A | * | 1/1995 | Nguyen ....................... | 455/323 |
| 5,448,197 A | * | 9/1995 | Sagawa et al. .............. | 327/408 |
| 5,495,194 A | * | 2/1996 | Sugawara .................... | 327/113 |
| 5,680,078 A | * | 10/1997 | Ariie et al. .................. | 332/178 |
| 5,717,364 A | * | 2/1998 | Ariie et al. .................. | 332/135 |
| 5,789,963 A | * | 8/1998 | Sakusabe .................... | 327/356 |
| 6,194,947 B1 | * | 2/2001 | Lee et al. .................... | 327/359 |
| 6,239,645 B1 | * | 5/2001 | Tsukahara et al. .......... | 327/359 |

\* cited by examiner

Primary Examiner—Terry D. Cunningham
Assistant Examiner—Hai L. Nguyen
(74) Attorney, Agent, or Firm—H.C. Lin Patent Agent

(57) ABSTRACT

A MOSFET operating as a mixer has its drain biased at the knee of the $I_D$ vs $V_{DS}$ characteristic. A local oscillator voltage is applied to the gate and a RF signal voltage is applied to the drain through a singled-ended source follower. The nonlinear curvature at the knee produces a beat frequency current. This mixer requires less supply voltage, and results in more conversion gain and less feed-through of the RF input signal than the Gilbert multiplier. Conversely, the RF voltage can be applied to the gate and the local oscillator voltage can be applied to the drain.

3 Claims, 5 Drawing Sheets

US 6,388,501 B2

1

MOSFET MIXER FOR LOW SUPPLY VOLTAGE

This is a continuation-in-part patent application of U.S. patent application Ser. No. 09/550,638 filed Apr. 17, 2000, now abandoned.

BACKGROUND OF THE INVENTION

(1) Field of Invention

This invention relates to mixers using MOSFETs, in particular the down converter of a superheterodyne radio receiver

(2) Description of the Related Art

In a conventional radio receiver, the incoming radio frequency is mixed with a local oscillator (LO) signal to produce a beat frequency, which is the intermediate frequency (IF). The IF is then amplified and filtered to attenuate other unwanted signals, A popular mixer circuit is the Gilbert multiplier. Since MOSFETs are widely used in circuit designs today, an MOSFET version of the Gilbert multiplier is shown in FIG. 1. Basically, a differential amplifier with a differential pair N2 and N3 is fed from a current source N1. The differential gain of the differential amplifier is proportional to the transconductance gm of N2 and N3. This transconductance varies as the square root of the dc drain current of N2 and N3, which is controlled by the drain current of N1. The dc drain current $I_D$ of N1 is controlled by the dc gate-to-source voltage $V_{GS1}$ of N1 and has a square law relationship with the gate-to-source voltage i.e. $I_{D1}$ $(V_{GS1}-Vt)^2$, where Vt is the threshold voltage of N1. When a local oscillator signal $V_{LO}$ of frequency $f_{LO}$ is applied differentially to N2 an N3 (i.e. $V_{LO+}$ and $V_{LO-}$ respectively), and a radio frequency signal $V_{rf}$ of frequency $f_{rf}$ is applied to the gate of N1, the output current of the differential amplifier is equal to $V_{LO}$*gm, and the gm is proportional to $Vrf*(V_{GS1}-Vt)$. When the $V_{rf}$ is multiplied by $V_{LO}$, a beat frequency $f_{if}=f_{rf}\pm f_{LO}$ intermediate frequency signal $V_{if}$ is produced.

While the Gilbert multiplier is widely used in the past, it has a number of drawbacks for low voltage and low power applications. In modern CMOS technology, the tendency is to use a low supply voltage $V_{DD}$: for instance 25 V for 0.25 $\mu$m technology and 1.8 V for 0.18 $\mu$m technology. In the Gilbert mixer, the current source is operating in the current saturation region of the $V_{DS}$ vs $I_D$ V-I characteristic N1' in FIG. 2 to obtain a higher transconductance and has a square law relation with $V_{rf}$. Therefore the drain voltage $V_{DS1}$ for the current source N1 is larger than the knee voltage $V_{D1'}$ of the N1' V-I characteristic curve. That knee voltage $V_{D1'}$ is equal to $V_{GS1}-Vt$.

Similarly, the differential pair N2 and N3 also must have its drain voltage higher than the knee voltage, i.e. $V_{D2}>2(V_{GS1}-Vt)$ as shown by the dotted V-I characteristic of N2 in FIG. 2. If a resistor is used as a load, another voltage drop VL will be added to $V_{DS1}$ to be supplied by the power supply $V_{DD}$. These three stacks of voltages, $V_{DS1}$, $V_{DS2}$ and VL, dictate that the supply voltage cannot be made very low. For a typical threshold voltage of 0.6 V, there is hardly any "head room" for signal voltage swing.

Lee et al disclosed in U.S. Pat. No. 6,194,947 a mixer structure which is basically a Gilbert mixer having a differential pair fed from a current source with its shortcomings.

Sakusabe disclosed in U.S. Pat. No. 5,789,963, FIGS. 1 & 9", a mixer operating with a drain to source voltage $V_{DS}$ in the current saturation region of a MOSFET without claiming

2 the exact $V_{DS}$. The RF signal is injected to the drain of the mixer by AC coupling (i.e. through a coupling capacitor). The AC coupling requires many additional components such the coupling capacitor Ca and other components such as Z1–Z8 and capacitors C1–C5 as shown in Sakusabe's FIG. 1

Another drawback of Sakusabe's mixer is that the gate of the mixer FET2 must be adjusted to set the quiescent drain voltage to the current saturation region for different operating currents. It is desirable to set the set the quiescent operating point (i.e. $V_{DS}$) automatically for different operating currents.

SUMMARY OF THE INVENTION

An object of this invention is to design a MOSFET mixer which requires a lower supply voltage than the Gilbert mixer or similar structure. Another object of this invention is to reduce the power consumption of the MOSFET mixer. Still another object of this invention is to provide a high conversion gain of the mixer. A further object of this invention is to set the operating point of the mixer at its optimum conversion gain automatically.

These objects are achieved by mixing the RF signal and the local oscillator signal at the knee of the output $V_{DS}$-$I_D$ characteristic of a MOSFET by dc coupling. At the knee, the characteristic has the sharpest curvature. The nonlinearity produces a maximum beat frequency signal. For implementation, a mixer MOSFET is biased at the knee of the $V_{DS}$-$I_D$ characteristic. The LO (or RF) signal voltage $V_{LO}$ (or $V_{rf}$) is applied at the gate of the mixer MOSFET, and the RF (or LO) signal voltage $V_{rf}$ (or $V_{LO}$) is injected at the drain of the mixer MOSFET. Then a beat frequency drain current is produced. Specifically, the gate of a single-ended mixer MOSFET is fed with a local oscillator signal and the drain of the mixer is dc coupled to a single-ended source follower with the gate fed from a radio frequency signal or vise versa.

DETAILED DESCRIPTION OF THE INVENTION

Figure 3:
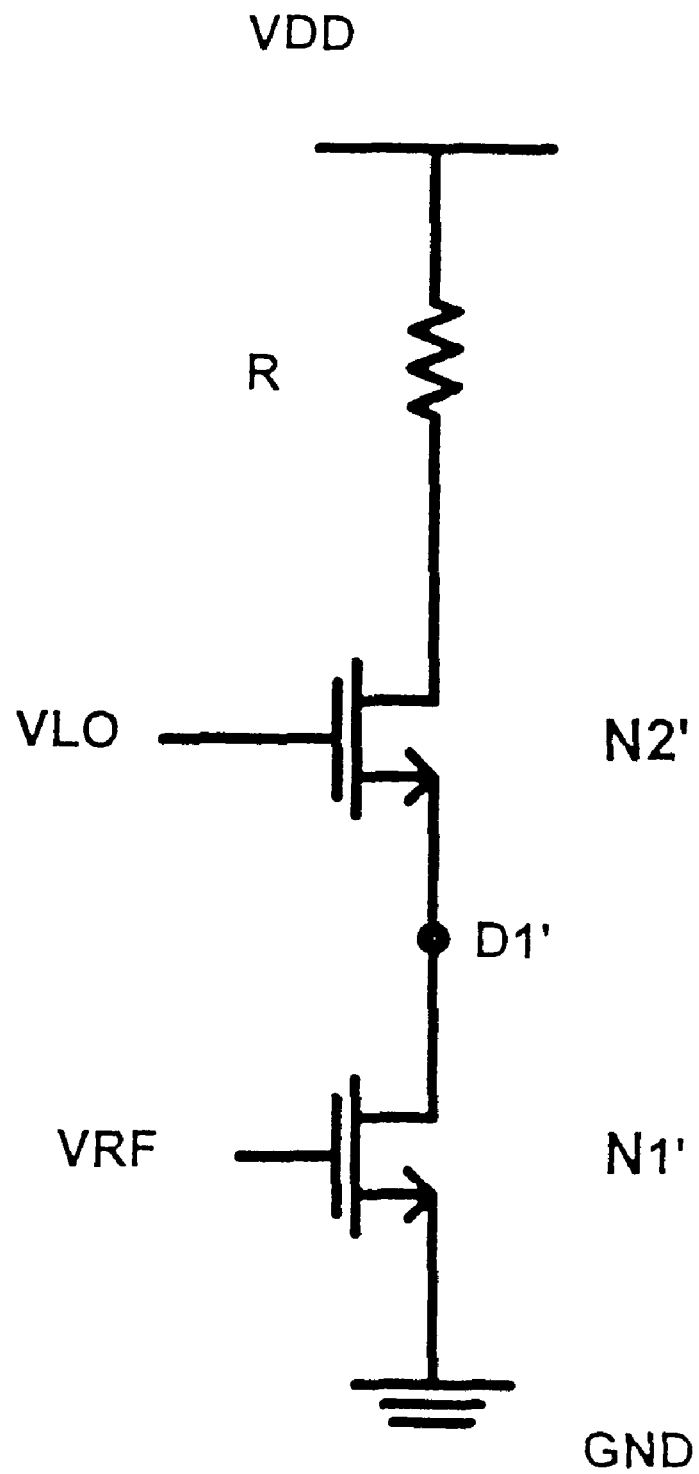
FIG. 3 shows the basic circuit of the present invention.

The basic circuit of the present invention is shown in FIG. 3. Two N-channel MOSFETs N2' and N1' are connected in series. The pull-down NMOS N1' has its source grounded and its drain D1 connected to the source of the pull-up NMOS N2. The drain D2 of N2' is connected through a load $R_L$ to the positive power supply $V_{DD}$. The RF voltage $V_{rf}$ is applied to the gate of N1', which has a dc bias voltage $V_{G1}$. The drain D1 of the N1' is set at a quiescent voltage $V_{knee}$ at the knee of the $V_{DS}$-$I_D$ characteristic of N1'. This voltage is $V_{knee}=(V_{G1}-Vt)$, where Vt is the threshold voltage of N1'. The appropriate $V_{knee}$ is set by choosing the appropriate dc gate voltage $V_{G2}$ of N2'.

A LO signal voltage $V_{LO}$ is applied to the gate of N2', and an RF voltage is applied to the gate of N1'. At the knee of the $V_{DS}$-$I_D$ characteristic of N1', the dc current:

$$I_D=(K/2)[2(V_{GS}-Vt)V_{DS}-V_{DS}^2] \quad (1)$$

where K is a transconductance parameter
The slope is:

$$\Delta I_D/\Delta V_{DS}=K(V_{GS}-Vt-V_{DS}) \quad (2)$$

Let a sine wave RF signal $V_{rf}\sin\omega_{rf}t$ be applied to the gate of N1' and a sine wave LO signal $V_{LO}\sin\omega_{LO}t$ be applied to the gate of N2'. Due to source follower action, $\Delta VDS=VLO\sin\omega_{LO}t$. Then equation (2) can be written as:

$$\Delta I_D = K[(V_{GS} + V_{rf}\sin\omega_{rf}t) - Vt - V_{DS}]V_{LO}\sin\omega_{LO}t \quad (3)$$
$$= KV_{LO}\sin\omega_{LO}t * V_{rf}\sin\omega_{rf}t + K(V_{GS} - Vt - V_{DS}) *$$
$$V_{LO}\sin\omega_{LO}t$$

The first term on the right side of equation (3) is a cross product term which yields a beat frequency signal $V_{if}$ $$V_{if}=KV_{LO}V_{rf}[\cos(\omega_{rf}-\omega_{LO})t]/2 \quad (4)$$

The sum frequency $KV_{LO}V_{rf}[\cos(\omega_{rf}+\omega_{LO})t]/2$ term in equation (3) can be filtered out in the IF amplifier. The dc term $(V_{GS}-Vt-V_{DS})$ is equal to zero at the knee.

The foregoing analysis also holds true if the local oscillator voltage $V_{LO}$ and the RF voltage $V_{rf}$ are interchanged.

Figure 1:
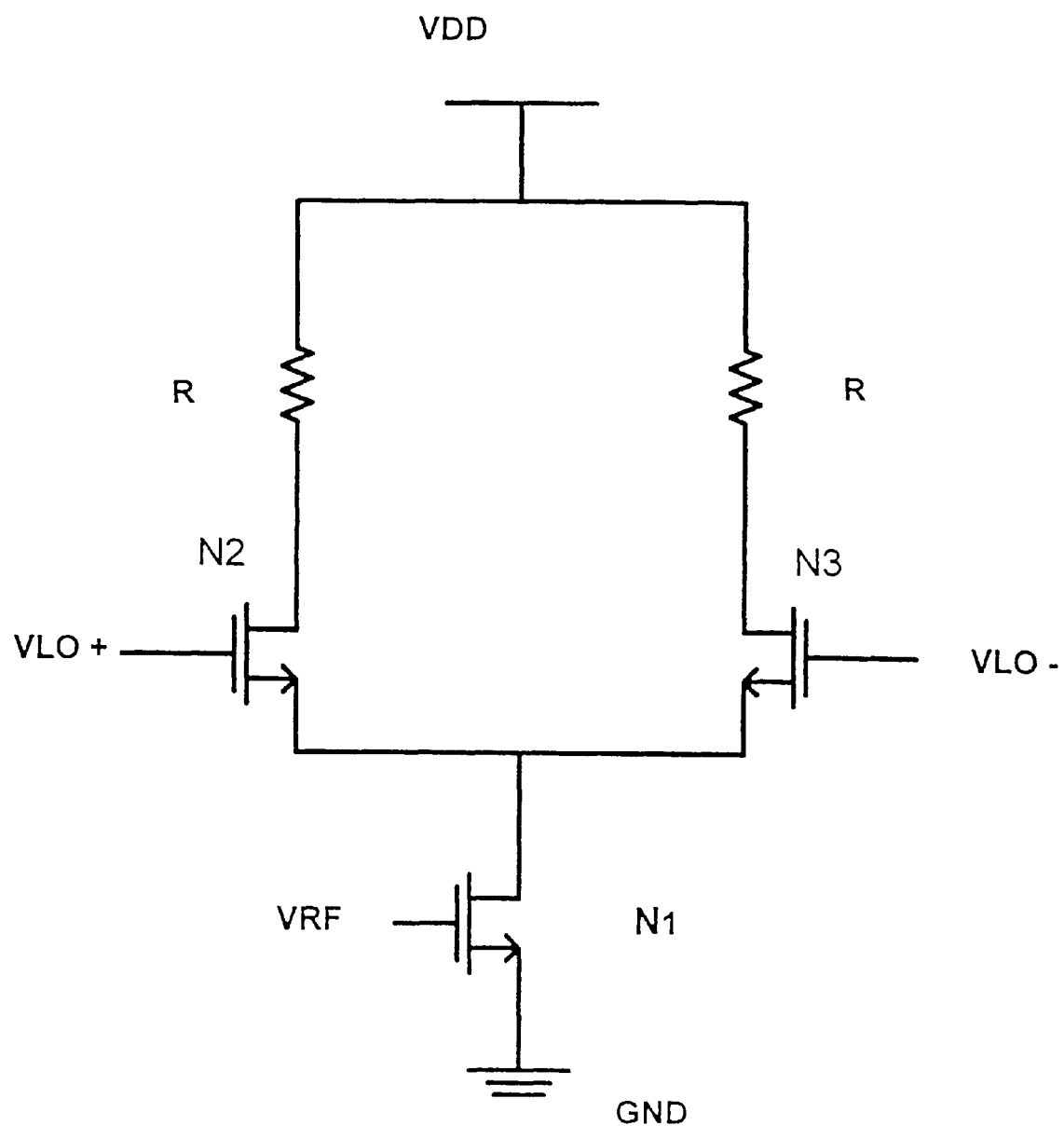
FIG. 1 shows a prior art Gilbert mixer.

For comparison with the Gilbert multiplier, it is assumed that $I_{D1}$ is the same in both cases, and all three MOSFETs N1, N2 and N3 in the Gilbert mixer as shown in FIG. 1 are the same. Then, the dc currents $I_{D2}=I_{D3}=I_{D1}/2$. The ac differential output current is:

$$I_{d2}=2gm_2 * V_{LO}/2 \quad (5)$$

where $gm_2$ is the transconductance of N2 and $$gm_2=(2KI_{D2})^{1/2}=(KI_{D1})^{1/2} \quad (6)$$

Combining (5) and (6), the ac output current becomes:

$$I_{d2}=V_{LO}(KI_{D1})^{1/2} \quad (7)$$

With the RF voltage $V_{g1}$ at the gate of N1, $$I_{D1}=K(V_{GS1}+V_{g1}-Vt)^2/2 \quad (8)$$

Let $V_{g1}=V_{rf}\sin\omega_{rf}t$ and $V_{LO}(t)=V_{LO}\sin\omega_{LO}t \quad (9)$ Combine equations (7), (8) and (9), $$I_{d2}=KV_{LO}f\sin\omega_{LO}t*(V_{rf}\sin\omega_{rf}t+V_{GS1}-Vt)/2^{1/2} \quad (10)$$

Note that the cross product term $KV_{rf}\sin\omega_{rf}t*V_{LO}\sin\omega_{LO}t$ $2^{1/2}$ of equation (10) is $\frac{1}{2}^{1/2}$ that of the cross product in equation (3). Therefore the present invention shown in FIG. 3 has $2^{1/2}$ times the conversion gain of the Gilbert mixer.

Figure 2:
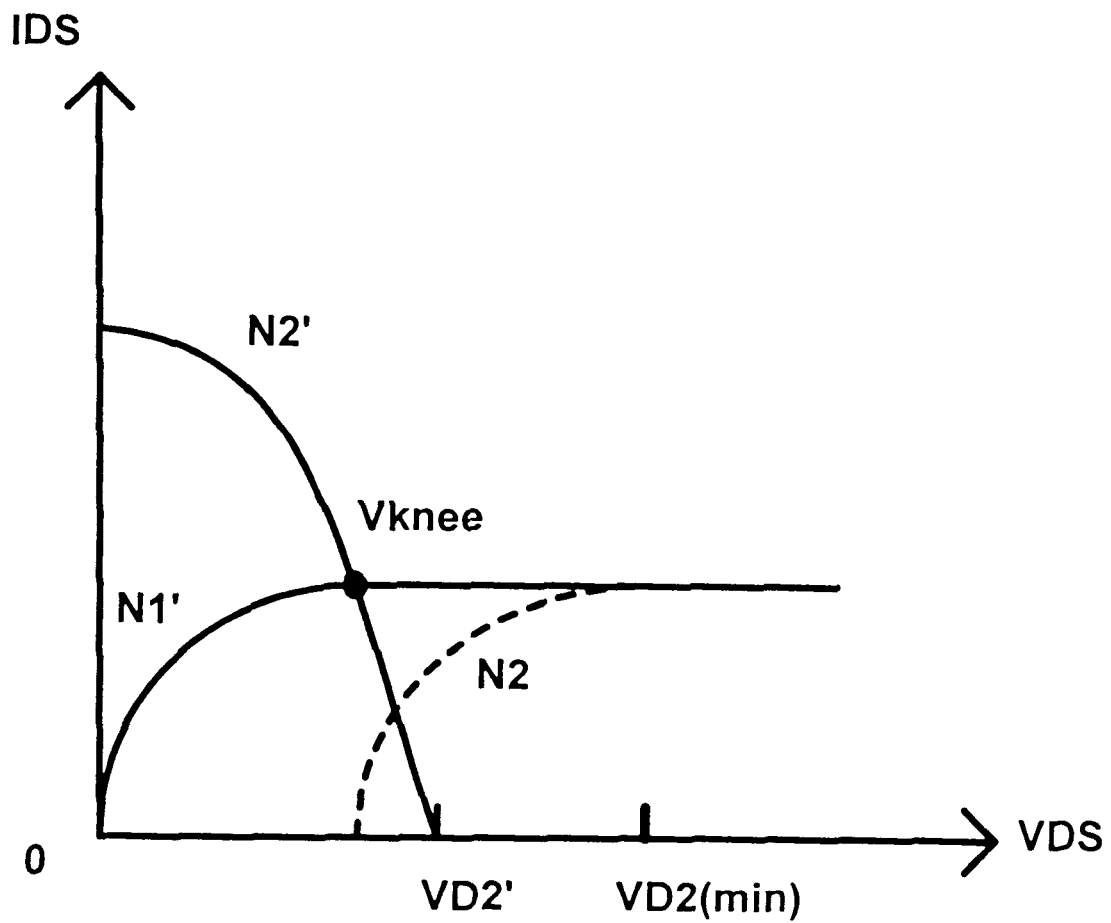
FIG. 2 shows the output V-I characteristic of MOSFETs.

In addition, the present invention has the advantage of a lower $V_{DS1}=V_{GS1}-Vt$, while the Gilbert mixer must use a $V_{DS1}>V_{GS1}-Vt$. Furthermore, the Gilbert's differential pair must be operating in the current saturation region to obtain high transconductance, i.e. N2 and N3 also require high drain voltage $V_{DS2}>V_{GS2}-Vt$. On the other hand, N2' of the present invention acts like a transmission gate, and the dc drain to source voltage $V_{DS2}'$ is equal to the voltage drop across the on resistance Ron of N2'. This voltage drop $V_{DS2}'(\approx I_{D2}'Ron)$ [is] can be less than $(V_{GS2}'-Vt)$ as shown by the load line of N2' in FIG. 2 and can be made low by reducing Ron (i.e. large width to length ratio of the gate of N2'). This reduction in $V_{DS1}'$ and $V_{DS2}'$ for FIG. 3 translates into a lower supply voltage $V_{DD}$, as indicted by $V_{D2}(min)$ for the Gilbert mixer and $V_{D2}'$ for the present invention. The characteristic of N2' in FIG. 2 assumes that N2' is twice as wide as N1' and equal to the total width of N2 and N3 of the Gilbert mixer. Note also the RF component $V_{rf}\sin\omega_{rf}t$ $(V_{GS1}-Vt-V_{DS})$ in equation (3) for the present invention is equal to zero, because $(V_{GS1}-Vt-V_{DS})$ is equal to zero at the knee. Conversely in equation (10) for the Gilbert mixer, the RF component $V_{rf}\sin\omega_{rf}t$ $(V_{GS1}-Vt)$ is not equal to zero, and must be filtered out to avoid intermodulation. On the other hand, the RF component in the present invention is equal to zero and need not be filtered. The elimination of filtering the RF component is an advantage. Although the image frequency $(\omega_{rf}+\omega_{LO})$ is still present, this frequency is far away from the beat frequency $(\omega_{rf}+\omega_{LO})$ and can be filtered out more easily than the lower RF signal $\omega_{rf}$. Thus, there is less feed-through of the input RF signal for the present invention than the Gilbert mixer, and the ratio of the magnitudes of the image frequency to the beat frequency is no worse than the Gilbert mixer.

Figure 4:
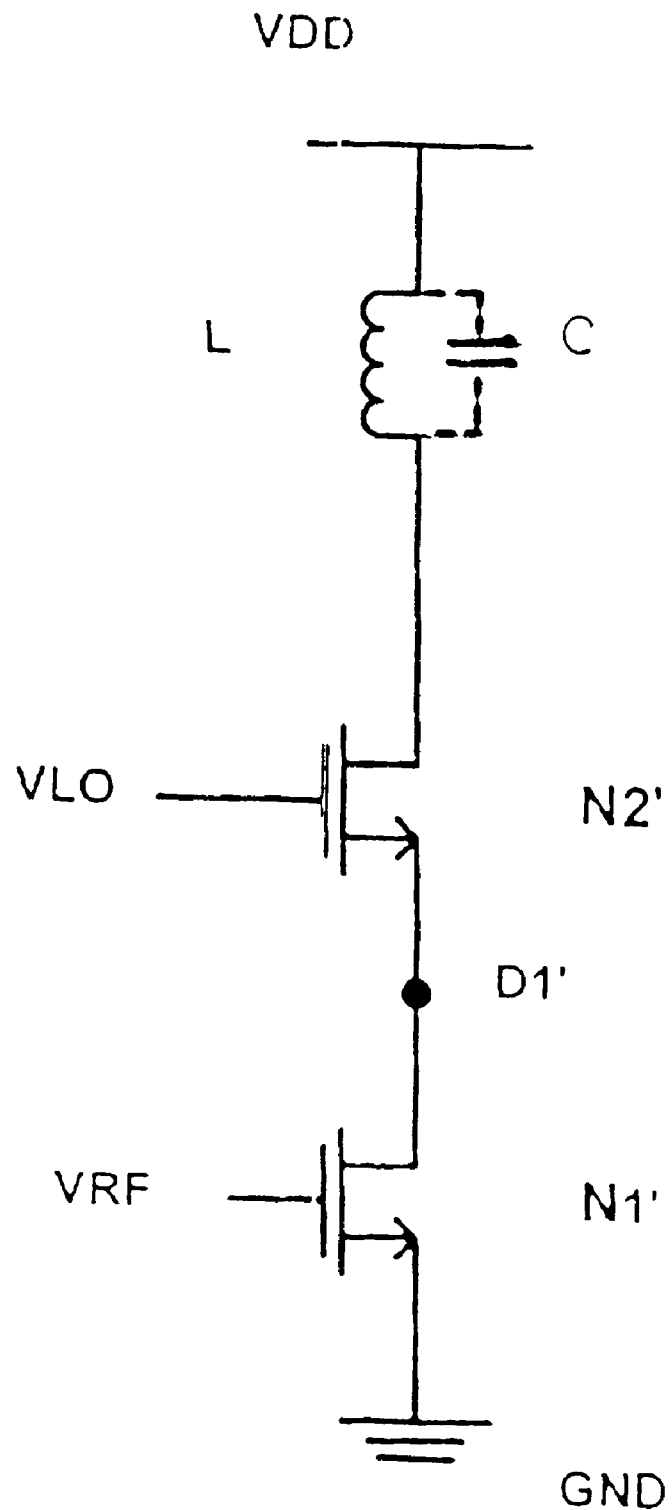
FIG. 4 shows the basic circuit with an inductive load.

In the foregoing analysis, it is assumed that the RF signal $V_{rf}$ is applied to the gate of N1' and the local oscillator voltage $V_{LO}$ is applied to the gate of N2'. From equation (4), the beat frequency IF voltage is proportional the product $V_{rf}*V_{LO}$. Therefore, from a theoretical standpoint where the voltage gain the source follower N2' is assumed to be unity, the conversion gain should be the same when $V_{LO}$ is applied to N1' and $V_{rf}$ is applied to N2'. In practice, however, the gain of the source follower N2' is less than unity. When $V_{rf}$ is applied to the gate of N2', the RF signal at the source of N2' is less than the signal at the gate. In either case, the noise output should be the same. As a result, the signal-to-noise ratio at the output of the mixer can be better for the case where the RF signal is applied to N1' and the local oscillator voltage is applied to N2'. While the load device shown in FIG. 3 is a resistor with a voltage drop, the power supply voltage $V_{DD}$ can further be reduced by using an inductive load device as shown in FIG. 4. The inductance L can be connected in parallel with a capacitor to form a tank circuit resonant at the beat or intermediate frequency $f_{if}$.

Besides the lower supply voltage and reduced RF feedthrough, the single-ended mixer of the present invention also has some other advantages over the balanced structure of the Gilbert circuit. A balanced structure requires differential RF and LO inputs and IF outputs. Most applications only provide single-ended RF and LO inputs and preferably single-ended IF output. As a result, the user need to provide single-to differential buffer amplifiers for RF and LO, and differential-to-single-ended buffer for the IF. Otherwise, differential filters are needed. Buffer amplifiers consume power while differential filters cost more and sometimes not available.

In the present invention, the dc knee voltage $V_{knee}$ of the first mixer MOSFET N1', $V_{G1}-Vt$, is equal to the dc source voltage $V_{S2}$ of the source follower N2', i.e. $V_{S2}=V_{G1}-Vt$. For equal size N1' and N2' and equal source currents and $V_{D2}\geq V_{G2}-Vt$, $V_{G1}-Vt=V_{G2}-V_{S2}-Vt$. Combining these relations yields $$V_{G2}=2V_{GS1}-Vt. \quad (11)$$

Figure 5:
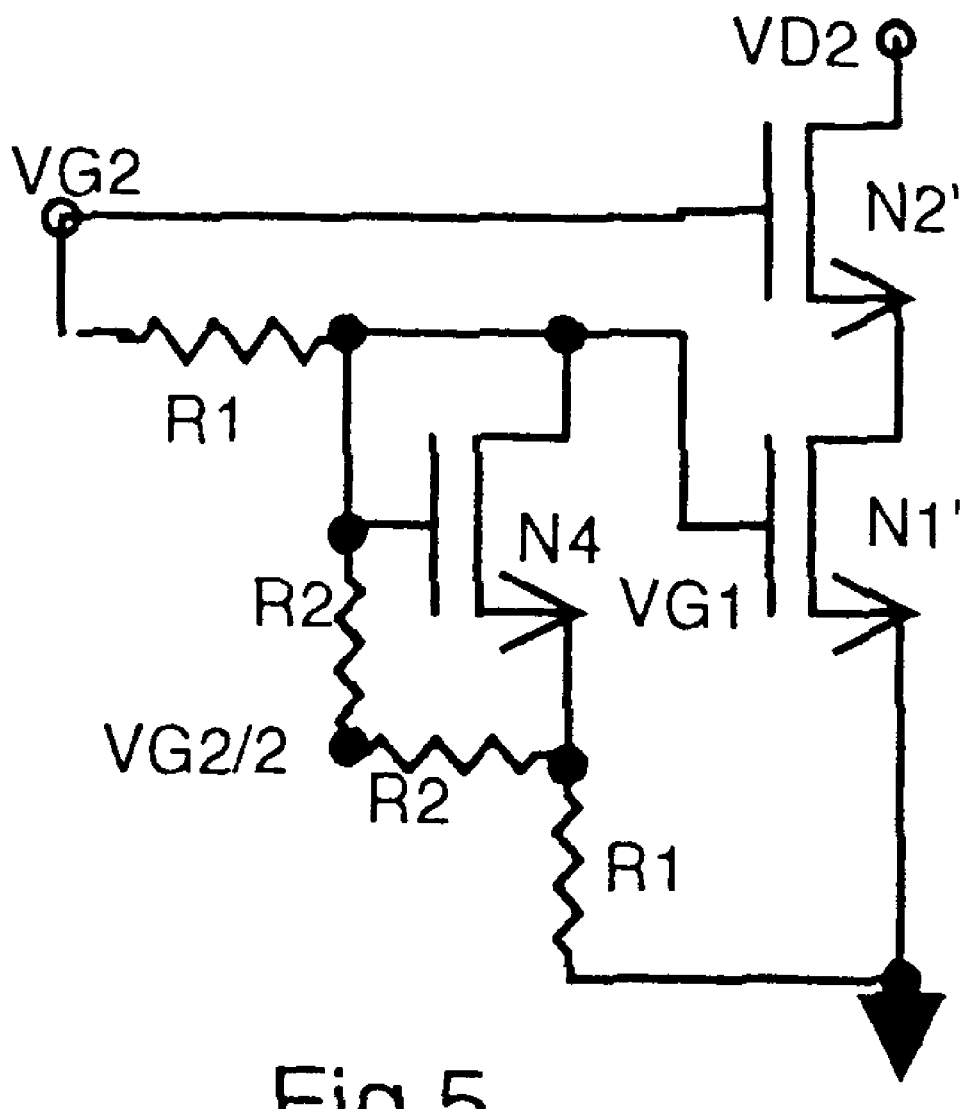
FIG. 5 shows a dc biasing circuit for automatically biasing the mixer MOSFET to the drain knee voltage.

So long as this relationship is satisfied, the mixer N1' is automatically biased to the knee without adjustment, regardless of the drain or source current of the mixer MOSFET N1'. FIG. 5 shows a circuit for satisfying this dc requirement. In this circuit, the supply voltage $V_{G2}$ is divided into one half by a voltage divider of two equal R1+R2. The divided voltage $V_{G2}/2$ is added with a divided threshold voltage Vt/2 across the MOSFET N4 in diode connection, which has a threshold voltage Vt from drain to source, to constitute the dc gate bias $V_{G1}$. The dc drain voltage $V_{D2}$ can be lower than ($V_{G2}$-Vt) as explained previously. As can be seen from FIG. 5, only a low supply voltage $V_{G2}$ less than twice the $V_{G1}$ is needed. The RF voltage and local oscillator voltage can readily be superimposed on VG1 and VG2 (not shown). For unequal size N1' and N2', another condition similar to eq.(11) can be derived as follows:

$$V_{G2}=[1+\sqrt{(K1/K2)}]V_{G1}-[\sqrt{(K1/K2)}]Vt \quad (12)$$

where K1 and K2 are the transconductance parameters as defined in eq.(1). $V_{G2}$ is the minimum dc supply voltage required to operate the present invention, and is compared favorably to the Gilbert mixer, because the dc drain voltage of N2 or N3 used for the Gilbert mixer shown in FIG. 1 requires a higher drain voltage than ($V_{G2}$-Vt) for proper operation of N2 and N3 in the current saturation region, the dc drain voltage of N1 requires a higher dc drain voltage than N1' for proper operation in the current saturation region, and the load R connected to $V_{DD}$ requires additional voltage drop. Thus the required dc voltage supply $V_{DD}$ for the Gilbert mixer is much higher than the dc supply voltage of the present invention. If $V_{G2}$ is used as the supply voltage $V_{DD}$ for N2' and the dc drain voltage $V_{D2}$ of N2' need only be less than ($V_{G2}$-Vt), then a large load as shown in FIG. 3 can be inserted between $V_{DD}$ and $V_{D2}$ to obtain more conversion gain. More importantly, the present invention has a higher conversion gain than the Gilbert mixer.

While the forgoing mixer is described using MOSFETs, similar technique should be applicable to bipolar transistors.

While the preferred embodiments of this invention have been described, it will be apparent to those skilled in the art that various modifications may be made in the embodiments without departing from the spirit of the present invention. Such modifications are all within the scope of this invention.

What is claimed is:

1. A mixer circuit using MOS field effect transistors (MOSFET) having a threshold voltage Vth, a drain characteristic with an ohmic region where the drain current $I_D$ increases with increasing drain-to-source voltage $V_{DS}$, and current saturation region where the drain current is constant with increasing $V_{DS}$ for a fixed gate-to-source voltage, comprising:

a first MOSFET having a first source, a first gate and a first drain;

a ground supply voltage applied to said first source;

a first dc quiescent gate voltage applied to said first gate;

a first radio frequency (RF) voltage V1 superimposed on said first dc quiescent gate voltage, a second MOSFET operating as a single ended source follower, having a drain connected to a dc power supply, a source dc-connected to said first drain of said first MOSFET, and a gate: applied with a dc gate voltage such that the dc drain-to-source voltage of the said first MOSFET is equal to a transition (knee) voltage $V_{knee}$ between said ohmic region and said current saturation region below said current saturation region of the drain characteristic of the said first MOSFET, and superimposed with a second RF voltage V2; and a means to sense the drain current of said second MOSFET having a frequency component equal the beat frequency of said V1 and said V2, wherein the first MOSFET and the second MOSFET are of equal size, the dc drain voltage of the second MOSFET is at least one threshold voltage less than the dc gate voltage, and the dc gate voltage of said second MOSFET is equal to twice the dc gate-to-source of said first MOSFET minus the threshold voltage (Vt) of said second MOSFET so that the dc drain-to-source voltage of said first MOSFET is automatically biased to the $V_{knee}$.

2. The mixer circuit as described in claim 1, wherein the dc gate-to-source of said first MOSFET is obtained by dividing the dc gate supply voltage of said second MOSFET into one half and adding one half of a threshold voltage.

3. The mixer circuit as described in claim 1, wherein the first MOSFET and second MOSFET are of equal size, the dc drain voltage of the second MOSFET is at least one threshold voltage less than the dc gate voltage, and the dc gate voltage of said second MOSFET is equal to [1+√(K1/K2)] times the dc gate voltage of said first MOSFET minus (√(K1+K2) times the threshold voltage of said second MOSFET, where K1 and K2 are the transconductance parameters of the first MOSFET and the second MOSFET, respectively, so that the dc drain-to-source voltage of said first MOSFET is automatically biased the knee voltage $V_{knee}$.

* * * * *